United States Patent [19]

Johnson et al.

[11] Patent Number: 4,634,658

[45] Date of Patent: Jan. 6, 1987

[54] PROCESS FOR PREPARING SURPRINT PROOF OF AN IMPROVED SUPPORT

[75] Inventors: Van B. Johnson; Douglas G. Adolphson, both of Towanda, Pa.

[73] Assignee: E. I. Du Pont de Nemours and Company, Wilmington, Del.

[21] Appl. No.: 851,919

[22] Filed: Apr. 14, 1986

Related U.S. Application Data

[63] Continuation of Ser. No. 686,919, Dec. 27, 1984, abandoned.

[51] Int. Cl.$^4$ ................................................ G03C 5/00
[52] U.S. Cl. .................................... 430/293; 430/271; 430/273
[58] Field of Search ........................ 430/271, 273, 293

[56] References Cited

U.S. PATENT DOCUMENTS

| | | | |
|---|---|---|---|
| 4,145,480 | 3/1979 | Kusama et al. | 430/271 |
| 4,174,216 | 11/1979 | Cohen et al. | 430/293 |
| 4,284,710 | 8/1981 | Burg | 430/271 |
| 4,321,320 | 3/1982 | Romano | 430/290 |
| 4,339,525 | 7/1982 | Bratt et al. | 430/271 |
| 4,427,761 | 1/1984 | Charles | 430/291 |
| 4,442,200 | 4/1984 | Asao | 430/538 |
| 4,443,535 | 4/1984 | Kiritani et al. | 430/538 |
| 4,476,153 | 10/1984 | Kiritani et al. | 430/538 |

*Primary Examiner*—Jack P. Brammer

[57] ABSTRACT

Process for preparation of improved surprint multilayer proof using at least three nonplanar nonsilver photoimaged elements, i.e., negative-working photosensitive element which are laminated sequentially to a support having a permeability to air of less than 0.1 cm$^3$/second, a peel adhesion value of at least 250 g/inch (98.48/cm) and a total luminous transmission not in excess of 25%, e.g., oriented polyethylene terephthalate film filled with polypropylene and/or with BaSO$_4$ or TiO$_2$. The surprints are useful as pre-press proofs.

9 Claims, No Drawings

PROCESS FOR PREPARING SURPRINT PROOF OF AN IMPROVED SUPPORT

This application is a continuation of application Ser. No. 686,919 filed Dec. 27, 1984, now abandoned.

DESCRIPTION

1. Technical Field

This invention relates to a process for preparing a surprint multicolor proof on a support. More particularly, this invention relates to the use of a substantially nonporous support in the preparation of a surprint multicolor proof.

2. Background Art

Reproduction processes are known wherein negative-working photosensitive elements are exposed imagewise through an original (phototool), and after being peeled apart nontacky and tacky image areas are formed. These elements can be used to prepare surprint multicolor proofs on a support. Surprint proofs obtained using negative-working photosensitive elements are described in Cohen and Fan U.S. Pat. No. 4,174,216. The elements in their unexposed state comprise (1) a nontacky photohardenable material with ethylenically unsaturated or benzophenone type groups and (2) a contiguous layer of a nonphotosensitive, tacky organic material with a strippable cover sheet adjacent layer (1) and a removable support adjacent layer (2). The process is a dry process utilizing dry particulate toners of suitable colors and is particularly useful in pre-press proofing.

In the preparation of a surprint proof as described in Cohen and Fan U.S. Pat. No. 4,174,216, the first negative-working photosensitive element is laminated to a paper support having a degree of stiffness, and which provides good adhesion, e.g., paper support coated with a pigment, e.g., BaSo$_4$/organic binder composition of Kromekote® cast-coated one-side paper manufactured by Champion Paper and Fiber Company. The second, third and optionally fourth negative-working photosensitive elements are sequentially laminated over the first laminated element. During the first two days after preparation of the surprint it has been noticed that the surprint halftone dot image exhibits a gradual increase in Equivalent Dot Areas (EDA), e.g., up to 5 or 6% growth in dot area in the first layer of the surprint with lesser amounts in the sequentially laminated elements. Halftone dot growth is undesirable since the pre-press proofs will not be an accurate copy of the image to be printed. Not only is the elimination or substantial reduction in dot growth of the surprint image layers necessary but adequate adhesion to the surprint support and between the individual layers of the surprint must be retained. The negative-working photosensitive elements are peel apart elements and require an adhesion balance between the exposed and unexposed areas. If, for example, a portion of the tacky contiguous layer is removed when the cover sheet is peeled from the photoadherent layer voids in the colored areas or a variation in color in the contiguous layer occur. This undesirable change in image color is known as "pickoff".

It is therefore desired to prepare a surprint multicolor proof which substantially eliminates an increase in equivalent dot areas as well as removal of colorant (pickoff) in an image formed in a negative-working element of the surprint. It is further desired that these results be achieved without changes in the negative-working photosensitive elements, toner formulations, or process of manufacture of the negative-working photosensitive elements.

DISCLOSURE OF INVENTION

In accordance with this invention there is provided in a process of preparing a surprint multicolor proof having at least three nonplanar nonsilver halide photoimaged elements having a color-toned layer sequentially laminated to a support, said elements in their unexposed state comprising a nontacky photohardenable material with ethylenically unsaturated or benzophenone type groups and a contiguous layer of a nonphotosensitive, tacky organic material wherein each color-toned photoimaged element has been exposed through a different color separation negative and the respective color-toned contiguous layers have been colored in a spectral region corresponding to the color separation used for the exposure, the improvement wherein the support to which the color-toned photoimaged elements are laminated has a permeability to air of less than 0.1 cm$^3$/second, a peel adhesion value of at least 250 grams/inch (98.4 grams/cm) and a total luminous transmission not in excess of 25%.

In practicing the process of the invention of preparing a surprint multicolor proof negative-working photosensitive elements as described in Cohen and Fan U.S. Pat. No. 4,174,216 are used. This patent is incorporated herein by reference. The negative-working elements comprise, in order from top to bottom, (1) a strippable cover sheet, (2) a photoadherent layer comprising a material with ethylenically unsaturated or benzophenone type groups, which is generally nontacky, (3) a tonable organic contiguous layer, e.g., a tacky, nonphotosensitive elastomeric layer which is tonable by application of particulate material, and (4) a sheet support.

Negative-working elements are used to form surprint elements as indicated above. Surprint elements are elements wherein at least three, preferably four photosensitive elements that have been imaged and colored with different colorants (nonplanar, nonsilver halide, colored, photoimaged elements) are sequentially laminated or bonded to a suitable support surface of the invention, described more fully below. In forming a surprint element, the cover sheet and sheet support present in the photosensitive elements are removed. Generally a negative-working or positive-working photosensitive element is applied to the outermost colored photoimaged element of the surprint element. When the outer element of the surprint is a negative-working element, it is uniformly or nonimagewise exposed and the cover sheet present is left in place. When the outer element is positive working, it is exposed and the cover sheet present is removed. Alternatively the positive working outer element may be exposed through a mezzotint and the cover sheet is removed leaving a tacky, layer on the surprint. The tacky outer layer of the surprint can be modified as described in Romano U.S. Pat. No. 4,321,302, Charles and Heiart U.S. Pat. No. 4,334,009, and Charles U.S. Pat. No. 4,427,761, the disclosures of which are incorporated herein by reference.

Generally, the surprint element has over its support four imaged colored photosensitive elements, e.g., photopolymer elements toned yellow, magenta, cyan and black, as well as an optional fifth nonimaged photopolymer layer or element. Colorants and toners, the particulate materials, used in preparing the surprints are described in Chu and Manger U.S. Pat. No. 3,620,726, Gray U.S. Pat. No. 3,909,282, Manger, Fickes and Long U.S. Pat. No. 4,215,193 and Cohen and Fan U.S. Pat. No. 4,286,046, which are incorporated herein by reference. The toners include cellulose acetate, cellulose acetate butyrate, ethyl cellulose, ethyl hydroxyethylcellulose resin particles having different colored pigments on their surfaces. The thickness of the nonsilver halide color-toned elements range from about 0.00029 to 0.00088 inch (0.0074 to 0.0224 mm), preferably 0.00058 to 0.00064 inch (0.0147 to 0.0163 mm).

The critical component of the surprint proof according to this invention is the support to which the negative-working photosensitive elements are sequentially laminated. In order to provide good quality surprint proofs the supports have the following important qualities: dimensional stability having less than one row of halftone dots in 40 inches (101.6 cm) determined by a 30×magnifier; flatness of less than 0.25 inch (6.35 mm) variation from a flat surface; static charge (surface resistivity) of $10^{12}$ ohm/square or less; color of $L^*>95, a^*$ about $0\pm0.5$, $b^*$ about $0\pm0.75$ determined by means of a spectrosensor. Other properties for the support are: opacity, expressed as total luminous transmission (determined for a support having a thickness of at least 100 μm when measured by ASTM test method D-1003-61), not in excess of 25%; good surface integrity, stiffness, strength, flexibility, and resistance to folding, cracking, scratching; uniform appearance without pits, dents, bumps, bubbles, scratches, voids, etc.; good thickness uniformity, and reproducibility sheet to sheet.

Previously used paper supports, e.g., Kromekote ® cast-coated one-side paper manufactured by Champion Paper and Fiber Company (nonfilled paper). Baryta ® paper (PRS-12) marketed by Intermills Corporation, Belgium have many of the desired support properties specified above. It has been found however that the previously used paper supports exhibit an increase in equivalent dot areas (EDA) over a period of time, e.g., during the first two days after a negative-working element is laminated to the support, imagewise exposed, the cover sheet is peeled and the bared surface of the tacky contiguous layer is toned with particulate colorant. The EDA is determined by measuring solid and halftone densities with a reflection densitometer and calculating the EDA according to the Murray-Davis calculation as is known to those skilled in the art. The paper and polymeric film supports described more fully below are useful in the process of this invention. The supports substantially eliminate the increase in EDA and possess greater than 250 g/inch (98.4 g/cm) peel adhesion to a negative-working photosensitive element and have the permeability to air values set forth below.

| | Sub | Permeability (cm³/sec) |
|---|---|---|
| Paper | | |
| 1 Baryta ® paper PRS-12 | Rhoplex ® acrylic + antistat coating (hand coated) | 0.0177 |
| 2 Schoeller | Polyethylene melt coated on two sides | <0.0089 |
| 3 Baryta ® paper SNR-15 (PRS-12) | Polyethylene terephthalate backed, tested on polyethylene terephthalate side | <0.0089 |
| 4 Kromekote ® | LOCR (TiO₂-filled chlorosulfonated polyethylene) | <0.0089 |
| 5 Baryta ® paper PRS-12 | Layer of unexposed Sample A of Example with polyethylene terephthalate film removed | <0.0089 |
| Polymeric film | | |
| 6 Polyethylene terephthalate, polypropylene filled, pearlescent, air spaces, | None | 0.0238 |
| 7 Polyethylene terephthalate, polypropylene and BaSO₄ filled | None | <0.0089 |
| 8 Polyethylene terephthalate, polypropylene and TiO₂ filled | None | <0.0089 |
| 9 Polyethylene terephthalate, 0.0010 inch (0.254 mm) | LOCR (TiO₂-filled chlorosulfonated polyethylene) | <0.0089 |

A useful type of support of this invention is paper, e.g., Baryta ® paper PRS-12 to which is laminated biaxially oriented polyethylene terephthalate film filled with polypropylene and/or BaSO₄ or TiO₂. A nonyellowing adhesive layer is present to permanently adhere the paper and film. The adhesive must not change color or degrade upon exposure to ultraviolet radiation, heat, or high temperature, humidity, pressure, sunlight, or other conditions normally encountered in manufacture, shipping, storage and use, e.g., lamination temperatures, ultraviolet exposure sources, etc. and the lifetime of the proof, e.g., generally $\leq 2$ months. Suitable adhesives are elastomers, e.g., cis-polybutadiene, styrene/butadiene, chlorosulfonated polyethylene, polypropylene (melt coated), etc. Another useful type of support is paper, e.g., Baryta ® paper PRS-12 coated sequentially with a layer of corona-treated polyethylene or polypropylene, and a layer of BaSO₄ and/or a TiO₂-filled organic binder, e.g., acrylates such as poly(methyl methacrylate), etc. and/or an elastomeric binder, e.g., cis-polybutadiene, styrene/butadiene, chlorosulfonated polyethylene, etc.

The permeability of the supports is determined by Bekk's test wherein there is measured the length of time required for 10 cm³ of air at suction of 0.5 atmosphere to pass through 1 cm² of receptor.

The peel adhesion value of the support is determined by peeling a one inch (2.54 cm) strip of the nonphotosensitive contiguous tacky organic material layer at a rate of 6000 inches (152.4 m)/minute and measuring the peel force with a calibrated load cell. A preferred mode of the invention is shown in the Example.

INDUSTRIAL APPLICABILITY

The process of the invention is useful in the preparation of high quality surprints utilizing negative-working photosensitive elements which are sequentially laminated to a substantially nonporous support whereby increase in equivalent dot areas of halftone dot images is substantially curtailed. The surprint supports which prevent dot growth have a permeability of less than 0.1 cm$^3$/second and a peel adhesion value of at least 250 g/inch (98.4 g/cm). The high quality surprints are useful as pre-press proofs in many segments of the printing market.

EXAMPLES

The following example illustrates the invention wherein the parts and percentages are by weight. The molecular weights of polymeric compounds are weight average weights ($\overline{M}_w$). The $\overline{M}_w$ of polymers can be determined by using a light scattering technique using known standard samples, e.g., polystyrene, polymethacrylic acid, polymethylmethacrylate, etc., as known to those skilled in the art.

EXAMPLE

Negative-working pre-press color proofs of the surprint type are prepared as described in Romano U.S. Pat. No. 4,321,320, column 5, line 21 to column 6, line 2, which is incorporated herein by reference. A polyethylene terephthalate film with the siloxane release coating is stripped from a tonable, tacky layer and the resulting element is then laminated at 100° C. to supports 1 to 9 disclosed above. The element is then exposed to a halftone negative, minus-blue, color separation film record, the exposure being made through the electrostatic discharge treated, clear polyethylene terephthalate film. This exposure is about 30 seconds on an exposing device identified as a Berkey-Ascor Vacuum Printer, fitted with a photopolymer lamp (2 KW) and a Kokomo ® glass filter (No. 400) Kokomo Opalescent Glass Co., Kokomo, IN. The distance between the lamp and the vacuum frame of this device is about 38 inches (96.52 cm). Other exposing devices that can be used include Violux ® and Addalux ® light sources. Generally the sources are rated at 5 KW although some may be rated 2 KW. After the exposure is made, the exposed element is taped securely to a suitable flat surface, and the clear polyethylene terephthalate film cover sheet is stripped by pulling at one corner with an even, continuous motion at an angle of about 135°–180°. This can be done at elevated temperature, e.g., 32° C. The resulting exposed, photopolymerized image photoadheres to the electrostatic discharge treated film and is removed with the film thus uncovering equivalent areas of the tacky, elastomer contiguous layer on the paper support. The bared areas of the contiguous layer are toned using a yellow toner, Dalamar ® Yellow (Pigment Yellow 74, C.I. No. 11741). A second laminate (III) having its polyethylene terephthalate film with release coating removed as described above is laminated to the surface of the yellow image and is exposed to a halftone, negative, minus-green color separation film record in registration. The clear, surface treated polyethylene terephthalate film of the second laminate is stripped from the contiguous layer leaving bared an image which is toned with a magenta toner as described above. The process is then repeated for the minus-red (cyan toner) and black negative records. The magenta, cyan and black toners used are, respectively, Quindo Magenta (C.I. Pigment Red 122 and Indo Brilliant Scarlet toner (Pigment Red 123, C.I. #71145) and 50% cellulose acetate, prepared as described in Example 11 of Manger et al. U.S. Pat. No. 4,215,193; phthalocyanine cyan toner, a dispersion of 50% mixture of Monastral ® Blue G (copper Phthalocyanine Pigment Blue 15, C.I. #74160) and Monastral ® Green G (Pigment Green 7, C.I. #74260) and 50% cellulose acetate prepared as described in Example 1 of Manger et al U.S. Pat. No. 4,215,193; and carbon black toner, Carbon Black, Sterling ®NSN774 (C.I. Pigment Black 7, C.I. #77266) prepared as described in Example 10 of Manger et al U.S. Pat. No. 4,215,193, predispersed in pentaerythritol resin. This procedure yields an excellent four-color negative surprint proof. An increase in EDA and pickoff are substantially eliminated when a support of the invention is used. When control supports such as Baryta ® paper PRS-12 and Baryta ® paper SNR-15 (on paper side) are used EDA is increased over a 48-hour period.

We claim:

1. In a process of preparing a surprint multicolor proof having at least three nonplanar nonsilver halide photoimaged elements having a color-toned layer, sequentially laminated to a support, said elements in their unexposed state comprising a nontacky photohardenable material with ethylenically unsaturated or benzophenone type groups and a contiguous layer of a nonphotosensitive, tacky organic material wherein each color-toned photoimaged element has been exposed through a different color separation negative and the respective color-toned contiguous layers have been colored in a spectral region corresponding to the color separation used for the exposure, and wherein said support has a peel adhesion value with respect to said contiguous layer of at least 250 grams/inch (98.4 grams/cm) and a total luminous transmission not in excess of 25%, the improvement, which substantially curtails increases in equivalent dot areas of halftone dot images, wherein the support to which the color-toned photoimaged elements are laminated is a paper coated with an organic polymeric layer, having a permeability to air of less than 0.1 cm$^3$/second.

2. A process according to claim 1 wherein the support is a paper surface coated with a TiO$_2$ and/or BaSO$_4$-filled organic and/or elastomeric polymer layer.

3. A process according to claim 1 wherein the support is paper coated with at least one organic polymeric layer selected from the group consisting of polyethylene terephthalate, polyethylene, polypropylene, polyacrylate, cis-polybutadiene, chlorosulfonated polyethylene, and a copolymer of styrene/butadiene.

4. A process according to claim 1 wherein the support is paper coated sequentially with a corona-treated polyethylene or polypropylene layer and a layer of BaSO$_4$- and/or TiO$_2$-filled organic and/or elastomeric binder.

5. A process according to claim 4 wherein the elastomeric binder is chlorosulfonated polyethylene.

6. A process according to claim 1 wherein the support is paper to which an oriented polyethylene terephthalate film filled with BaSO$_4$, TiO$_2$ and/or air voids is laminated with a permanent, nonyellowing adhesive.

7. A process according to claim 6 wherein the support is paper to which is laminated a biaxially oriented polyethylene terephthalate film filled with polypropylene and BaSO$_4$.

8. A process according to claim 6 wherein the support is paper to which is laminated a biaxially oriented polyethylene terephthalate film filled with polypropylene and TiO$_2$.

9. In a process of preparing a surprint multicolor proof having at least three nonplanar nonsilver halide photoimaged color-toned elements sequentially laminated to a support, comprising the steps of:

(1) laminating to a support, an element, which in its unexposed state comprises, in order, a strippable coversheet, a layer comprising a nontacky photohardenable material with ethylenically unsaturated or benzophenone type groups, and a tonable contiguous layer of nonphotosensitive organic material, said support having a peel adhesion value with respect to said tonable contiguous layer of at least 250 grams/inch (98.4 grams/cm) and a total luminous transmission not in excess of 25%, (2) exposing said element to actinic radiation through a color separation negative whereby the exposed areas become photohardened, (3) removing said photohardened areas from the contiguous tacky later, (4) toning the bared tonable contiguous layer with colorant or particulate material having a color in a spectral region corresponding to the color separation used for the exposure, (5) repeating said laminating, exposing, removing, and toning steps at least twice, with each element being exposed through a different color separation negative and the respective tonable contiguous layer being toned with colorant or particulate material having a color in a spectral region corresponding to the color separation negative used, the improvement, which substantially curtails increases in equivalent dot areas of halftone dot images, wherein the support to which the color-toned photoimaged elements are sequentially laminated is a paper coated with an organic polymeric layer, having a permeability to air of less than 0.1 $cm^3$/second.

* * * * *